United States Patent
Endo et al.

(10) Patent No.: US 6,255,640 B1
(45) Date of Patent: Jul. 3, 2001

(54) SOLID-STATE IMAGE SENSING DEVICE AND METHOD FOR MANUFACTURING SOLID-STATE IMAGE SENSING DEVICE

(75) Inventors: Hiroki Endo; Taichi Natori, both of Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/277,707

(22) Filed: Mar. 26, 1999

(30) Foreign Application Priority Data

Mar. 27, 1998 (JP) .................................................. 10-081675

(51) Int. Cl.[7] ..................... H01L 31/0232; H01L 27/146; H01L 21/77
(52) U.S. Cl. ....................... 250/208.1; 250/216; 257/432; 438/70
(58) Field of Search ................................. 250/208.1, 216, 250/214.1, 214 R, 227.11; 257/59, 72, 225, 229, 230, 232, 233, 294, 432, 435, 436, 443; 438/16, 57, 60, 69, 70, 71, 75; 349/95, 106

(56) References Cited

U.S. PATENT DOCUMENTS

| 4,667,092 | | 5/1987 | Ishihara . | |
|---|---|---|---|---|
| 5,371,397 | * | 12/1994 | Maegawa et al. | 257/432 |
| 5,466,926 | | 11/1995 | Sasano et al. . | |
| 5,593,913 | | 1/1997 | Aoki . | |
| 5,682,215 | * | 10/1997 | Nishihara et al. | 349/95 |
| 5,689,548 | * | 11/1997 | Akio | 257/232 |
| 5,739,548 | * | 4/1998 | Shigeta et al. | 257/59 |
| 5,796,154 | * | 8/1998 | Sano et al. | 257/432 |
| 6,030,852 | * | 2/2000 | Sano et al. | 438/69 |
| 6,104,021 | * | 8/2000 | Ogawa | 250/208.1 |

FOREIGN PATENT DOCUMENTS

| 0 718 665 A2 | 12/1994 | (EP) . |
|---|---|---|
| 0 741 418 A2 | 5/1995 | (EP) . |
| 0 744 778 A1 | 5/1995 | (EP) . |
| 03230101 | 10/1991 | (JP) . |

\* cited by examiner

*Primary Examiner*—John R. Lee
(74) *Attorney, Agent, or Firm*—Ronald P. Kananen; Rader, Fishman & Grauer

(57) ABSTRACT

The picture quality of a solid-state image sensing device is improved and its manufacturing process is simplified. The solid-state image sensing device comprises an interlayer film having a recess above a light receiving sensor unit as well as an intra-layer color filter having a protuberance formed by filling the recess in accordance with the curved surface of the recess, the protuberance having a curvature required for collecting the incident light onto the light receiving sensor unit.

9 Claims, 8 Drawing Sheets

SOLID-STATE IMAGE SENSING DEVICE AND METHOD FOR MANUFACTURING SOLID-STATE IMAGE SENSING DEVICE

BACKGROUND OF THE INVENTION

1. Field of the Invention

The present invention relates to a solid-state image sensing device and a method for manufacturing a solid-state image sensing device.

2. Description of the Related Art

In recent years, a solid-state image sensing device has been miniaturized and its pixel becomes increasingly densified, with which a light receiving area is reduced and a deterioration of characteristics such as a drop of the sensitivity or the like is caused.

It has been proposed as measures against the drop of sensitivity to promote a light collecting efficiency on to a light receiving sensor unit by providing, e.g. a microlens, that is called an on-chip lens and an intra-layer lens.

A structure of the conventional solid-state image sensing device will be described below.

FIG. 1 shows a schematic sectional view of a conventional solid-state image sensing device 100 in the solid-state image sensing device with a structure having an intra-layer lens.

As shown in FIG. 1, a large number of light receiving sensor units 102 for performing the photoelectric conversion are formed in an array on a silicon substrate 101.

On one side of the light receiving sensor unit 102 is formed a charge transfer element 104 through a readout gate 103. On the other side thereof is formed a charge transfer element 104 to the other light receiving sensor unit 102 through a channel stop 105.

A signal charge derived from the photoelectric conversion by the light receiving sensor unit 102 is read out to the one charge transfer element 104 through the readout gate 103 and further transferred by the charge transfer element 104.

Moreover, on the surface of the silicon substrate 101 is provided a $SiO_2$ insulator film 106 formed by the thermal oxidation method or CVD (Chemical Vapor Deposition) method, and so forth.

On the insulator film 106 nearly just above the charge transfer element 104 is formed a transfer electrode 107 made of polysilicon, and besides another transfer electrode (not shown) is formed in such a manner as partially overlapped with the transfer electrode 107.

On the surface of these transfer electrodes 107, i.e. on the top surface and the side surface thereof is formed, an interlayer insulator film 108 which covers the transfer electrode 107 and further covers the insulator film 106 on the light receiving sensor unit 102 facing between the transfer electrodes 107.

On the interlayer insulator film 108 is formed a light shielding film 109 which covers the transfer electrode 107. The light shielding film 109 has an overhang portion 109a which projects just over the light receiving sensor unit 102 in order to restrict a smear. An opening 110 is formed just over the light receiving sensor unit 102 in such a manner as surrounded by the overhang portion 109a. In addition, the light shielding film 109 is formed by a metal of high melting point, e.g. tungsten.

On the light shielding film 109 is formed an interlayer film 111 made of BPSG (boron phosphorus silicate glass), which covers the light shielding film 109 and the interlayer insulator film 108 facing the opening 110. The interlayer film 111 is subjected to the reflow processing in order to form a recess 111a formed on the light receiving sensor unit 102 between the transfer electrodes 107. This recess 111a is processed to be adjusted to have a required curvature.

On this interlayer film 111 is formed a passivation film 112 covering its surface.

The recess 111a of the interlayer film 111 is filled by an intra-layer lens material which forms an intra-layer lens 114 over the passivation film 112, the lens having a protuberance with the required curvature in accordance with the recess 111a.

This intra-layer lens 114 is made flat of its surface by the known so-called resist etch back process or the CMP process (chemo-mechanical polishing process).

On the flattened intra-layer lens 114 is formed a color filter layer 116. This color filter layer 116 can be formed by a known process using such resin, and so forth. into which a pigment is dispersed.

On the color filter layer 116 is formed a microlens 117 made of a transparent resin and the like. The microlens 117 directs an incident light to the opening 109a of the light shielding film 109 through the intra-layer lens 114 so that the light may be incident onto the light receiving sensor unit 102. Therefore, the curvature of the microlens 117 is chosen to have a desired value depending on a distance from the light receiving sensor unit 102 to the bottom plane of the microlens 117 in the solid-state image sensing device 100 shown in FIG. 1.

However, the solid-state image sensing device with the arrangement shown in FIG. 1 causes the following inconvenience.

Specifically, because the solid-state image sensing device 100 having the structure including the intra-layer lens 114 shown in FIG. 1 is provided with the intra-layer lens 114 and the color filter layer 116 respectively, an overall thickness from the light receiving sensor unit 102 to the bottom plane of the microlens 117 reaches the extent of 4 to 5 $\mu$m or more. This means that there is a large distance between the light receiving sensor unit 102 and the microlens 117.

When the distance from the light receiving sensor unit 102 to the microlens 117 becomes large in this manner, in the case where an incident light inclined relative to the microlens 117 increases, if the diaphragm of an image sensing lens of camera is opened as shown in FIG. 2, the light collected by the microlens 117 will deviate from the center of the opening of the light shielding film 109 as shown by broken lines in FIG. 2, thereby causing a rate of collecting the light onto the light receiving sensor unit 102 to be lowered. In other words, the dependence on F value goes worse and so the sensitivity to the parallel light is satisfactory, whereas the sensitivity drops remarkably toward the diaphragm being opened. Moreover, when the collected light approaches an opening end of the light shielding film 109, a signal charge is caused to be mixed in the adjacent light receiving sensor unit 102 or charge transfer area (not shown), thus making what is called a smear to occur.

Furthermore, because the curvature of the microlens 117 is determined depending on the distance from the light receiving sensor unit 102 to the microlens 117 as described above, when the distance from the light receiving sensor unit 102 to the microlens 117 increases, it will be necessary to make larger the curvature of the microlens accordingly.

When the curvature of the microlens 117 on the color filter 116 becomes large in this manner, a light L collected by the microlens 117 is rejected by an edge of the color filter 116, as shown in FIG. 1. This effects an increase of minute black spots, this causing the deterioration of picture quality.

SUMMARY OF THE INVENTION

In view of the above circumstances, it is an object of the invention to provide a solid-state image sensing device having a structure in which the distance from the light receiving sensor unit 102 to the microlens 117 is made shorter in order to eliminate the aforesaid inconvenience.

According to an aspect of the present invention, there is provided a solid-state image sensing device which comprises a light receiving sensor unit for making the photoelectric conversion on a substrate, an interlayer film having a recess above the light receiving sensor unit, and an intra-layer color filter, on the interlayer film, having a protuberance formed by filling the recess and following the curved surface of the recess, the protuberance having a curvature required for collecting the incident light onto the light receiving sensor unit. The intra-layer color filter has both functions of the intra-layer lens for collecting the incident light onto the light receiving sensor unit as well as the color filter, thus playing both these two roles.

According to another aspect of the present invention, there is provided a method for manufacturing a solid-state image sensing device which comprises the steps of forming a light receiving sensor unit on a substrate, forming a transfer electrode on the substrate, forming an interlayer insulator film over the transfer electrode, forming a light shielding film, piling to form an interlayer film over the light shielding film, forming a recess on the interlayer film, and forming an intra-layer color filter, on the interlayer film, having a protuberance formed by filling the recess and following the curved surface of the recess, the protuberance having a curvature required for collecting the incident light onto the light receiving sensor unit.

According to the structure of the solid-state image sensing device of the present invention, the intra-layer color filter has both functions of the intra-layer lens as well as the color filter According to the structure of the solid-state image sensing device of the present invention, because the intra-layer color filter has the function of the color filter and further has the function of the intra-layer lens which has the protuberance with the curvature required for collecting the incident light onto the light receiving sensor unit, there will be no need to provide the intra-layer lens and the color filter separately, which causes the distance from the light receiving sensor unit to the microlens to be lessened.

For this reason, even when a slant incident light relative to the microlens increases if the diaphragm of the image sensing lens of camera is opened, the collected light by the microlens will never deviate from the center of the opening of the light shielding film.

Moreover, because the distance from the light receiving sensor unit to the microlens can be made small, the curvature of the microlens is chosen to be small. This makes it possible to avoid that the light L collected by the microlens is rejected by the edge of the color filter.

According to the method for manufacturing the solid-state image sensing device of the present invention, it will be possible to eliminate that the intra-layer lens and the color filter are formed separately in the manufacturing process of the solid-state image sensing device.

DESCRIPTION OF THE PREFERRED EMBODIMENTS

A solid-state image sensing device according to the present invention comprises the light receiving sensor unit on the substrate, for making the photoelectric conversion, a charge transfer unit for transferring a signal charge readout from the light receiving sensor unit, and a transfer electrode provided nearly just above the charge transfer unit on the substrate through an insulator film, which comprises an interlayer film on the light receiving sensor unit, having the recess with a predetermined curvature, comprises an intra-layer color filter on the interlayer film, having the protuberance formed by filling the recess and following the curved surface of the recess, the protuberance having the curvature required for collecting the incident light onto the light receiving sensor unit, and comprises a microlens on the intra-layer color filter. This intra-layer color filter has both functions of the intra-layer lens for collecting the incident light onto the light receiving sensor unit as well as the color filter.

An example of the solid-state image sensing device according to the present invention will be described below. The present invention is, however, not limited to the following example.

Figure 3:
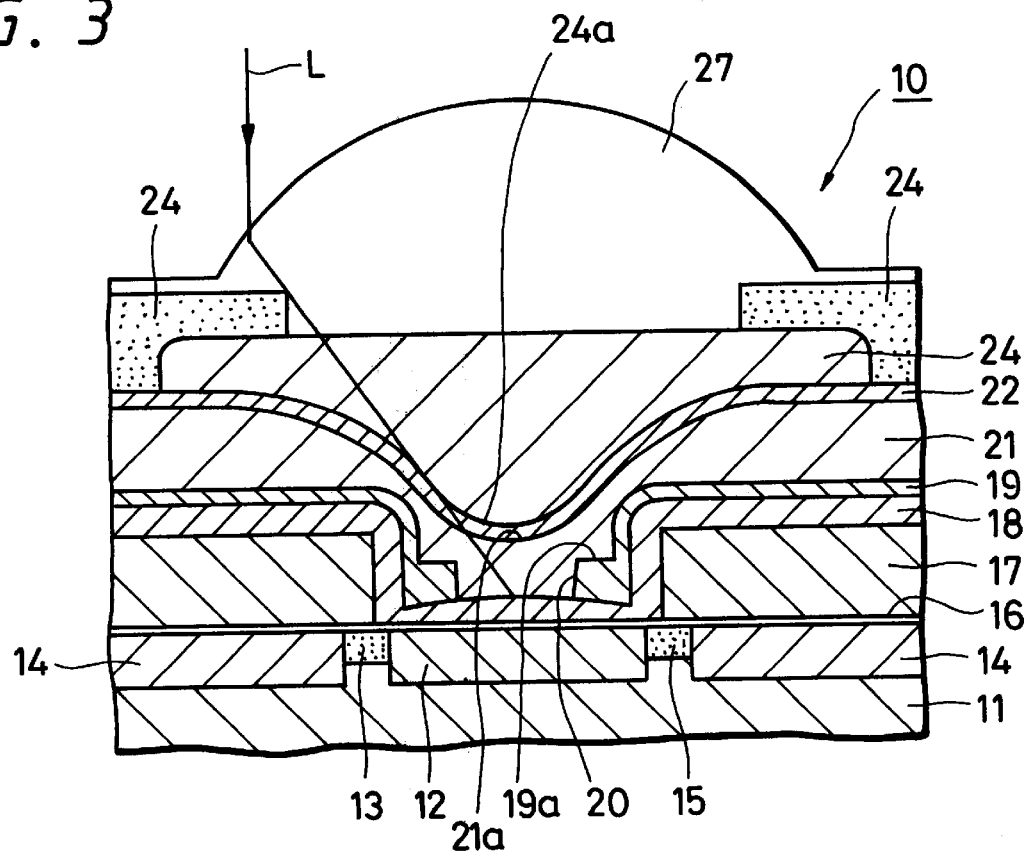
FIG. 3 is a schematic sectional diagram showing the solid-state image sensing device according to the present invention.
Figure 4:
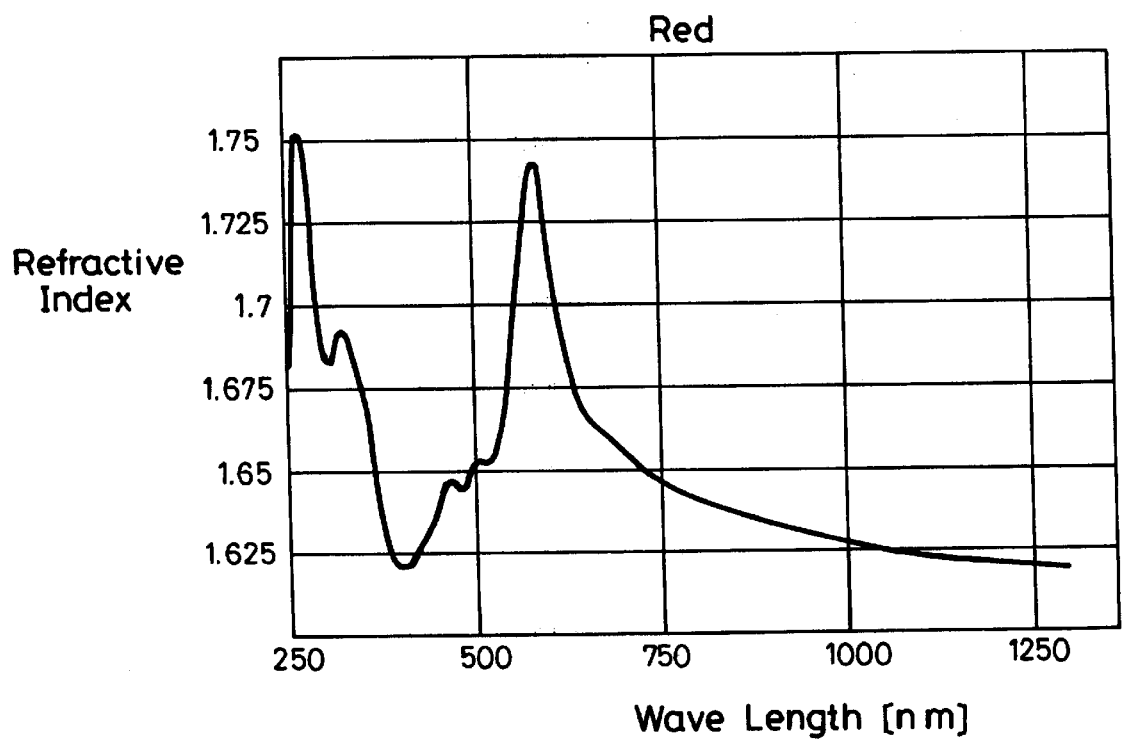
FIG. 4 is a diagram showing the relation between the wave length and the refractive index of a red photosensitive resin forming the intra-layer color filter.
Figure 5:
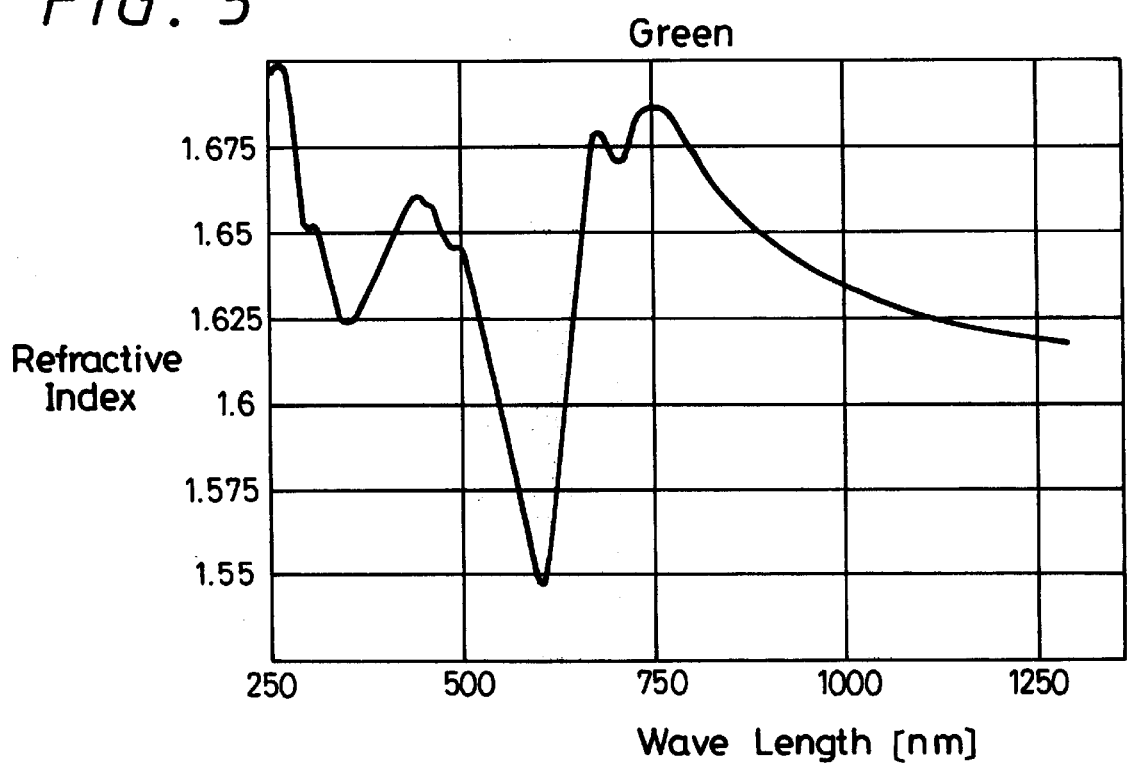
FIG. 5 is a diagram showing the relation between the wave length and the refractive index of a green photosensitive resin forming the intra-layer color filter.
Figure 6:
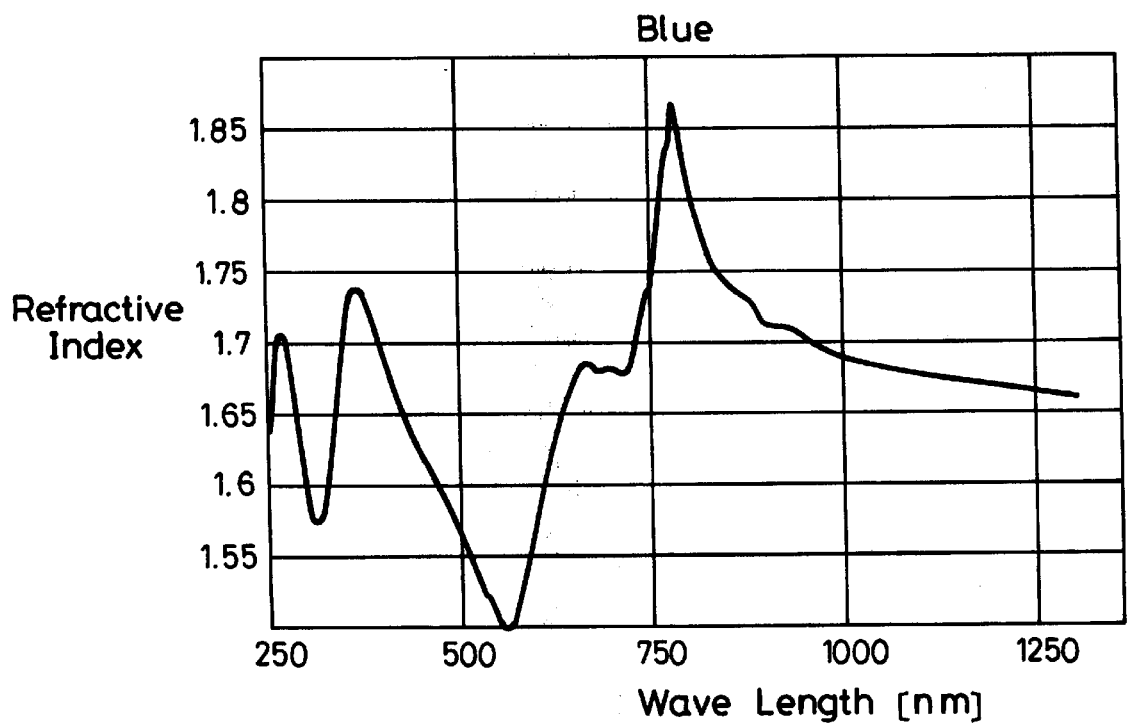
FIG. 6 is a diagram showing the relation between the wave length and the refractive index of a blue photosensitive resin forming the intra-layer color filter.
Figure 7:
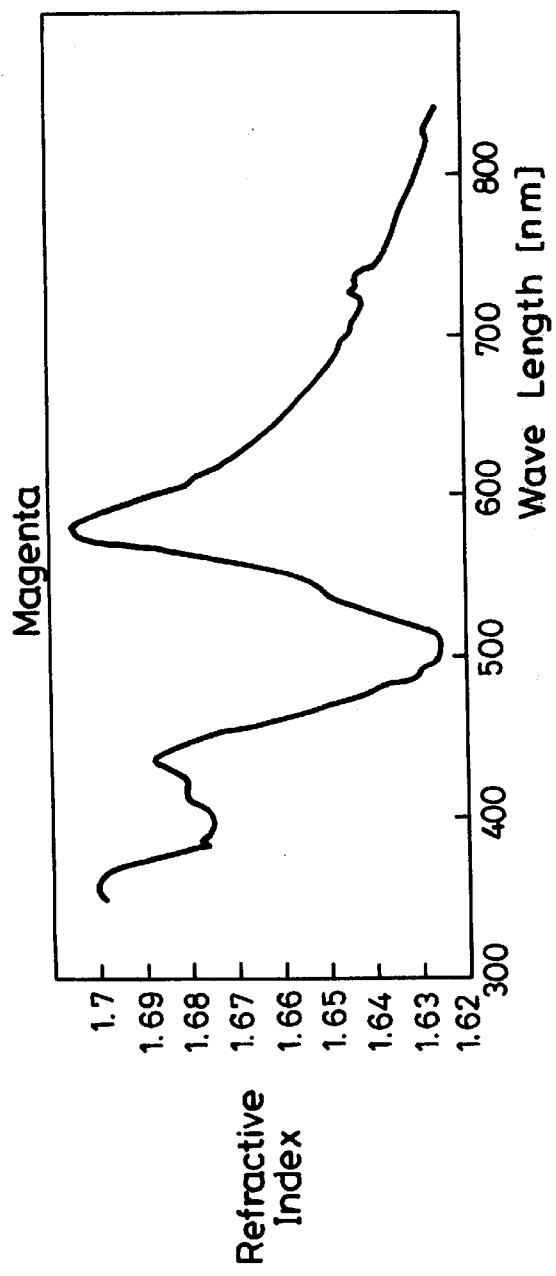
FIG. 7 is a diagram showing the relation between the wave length and the refractive index of a magenta photosensitive resin forming the intra-layer color filter.
Figure 8:
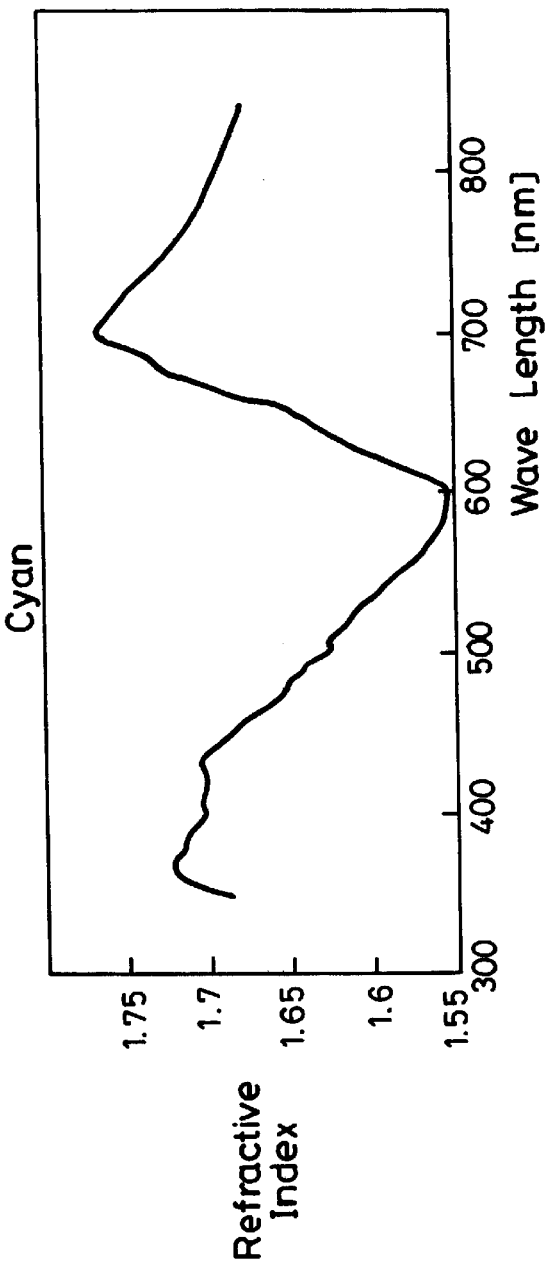
FIG. 8 is a diagram showing the relation between the wave length and the refractive index of a cyan photosensitive resin forming the intra-layer color filter.
Figure 9:
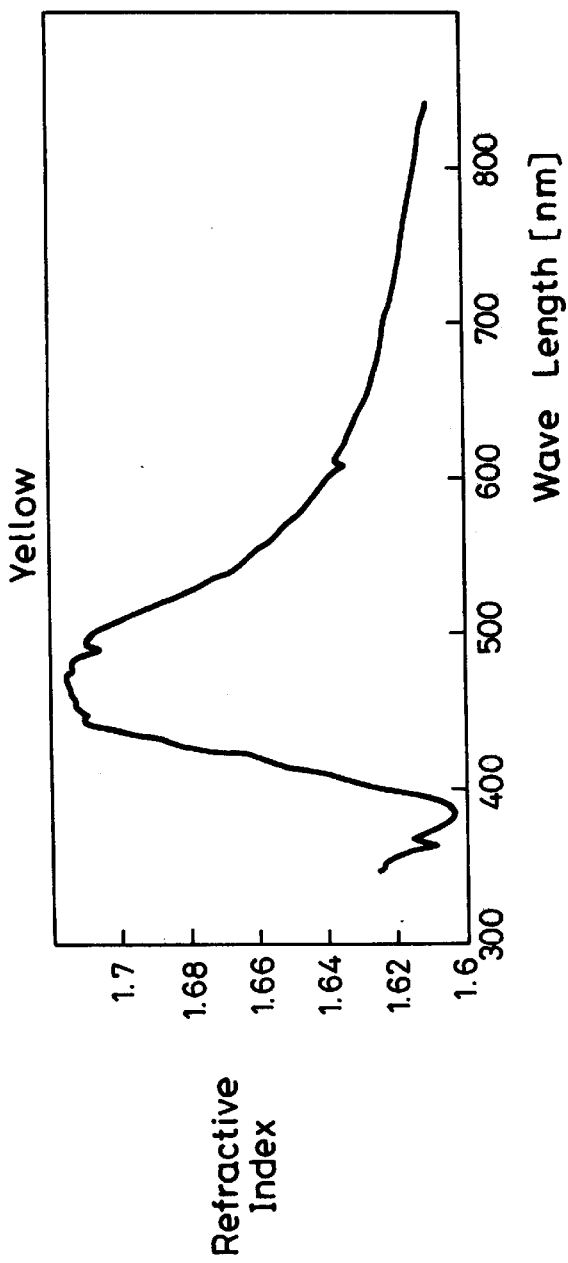
FIG. 9 is a diagram showing the relation between the wave length and the refractive index of a yellow photosensitive resin forming the intra-layer color filter.

FIG. 3 shows a schematic sectional view of an example of a solid-state image sensing device 10 according to the present invention.

As is shown in FIG. 3, on a substrate 11 made of e.g. silicon are formed in array a great number of light receiving sensor units 12 for carrying out the photoelectric conversion.

On the silicon substrate 11, on one side of the photo sensor 12 is formed a charge transfer unit 14 through a readout gate 13, and on the other side thereof is formed another charge transfer unit 14 through a channel stop 15.

It is arranged that a signal charge derived from photoelectric conversion made by the light receiving sensor unit 12 is read out into the other charge transfer unit 14 through the readout gate 13 and further transferred by the charge transfer unit 14.

In addition, on the surface of the silicon substrate 11 is provided an insulator film 16 made of $SiO_2$ formed by, e.g. the thermal oxidation process or the CVD process.

On the insulator film 16, nearly just above the charge transfer unit 14 is formed a transfer electrode 17 made of, e.g. polysilicon and further, another transfer electrode (not shown) is formed in such a manner as to be overlapped partially with the transfer electrode 17.

On the surface of these transfer electrodes 17, i.e. on the top surface and the side surface thereof is formed an interlayer insulator film 18 which covers the transfer electrode 17 and further covers the insulator film 16 on the light receiving sensor unit 12 facing between the transfer electrodes 17.

On the interlayer insulator film 18 is formed a light shielding film 19 which covers the transfer electrode 17 and is made of a metal having a high melting point, e.g. tungsten (W) or the like. The light shielding film 19 has an overhang portion 19a which projects just over the light receiving sensor unit 12 in order to restrict a smear. An opening 20 is formed just over the light receiving sensor unit 12 in such a manner as surrounded by the overhang portion 19a.

On the light shielding film 19 is formed an interlayer film 21 made of, e,g, BPSG (boron phosphorus silicate glass), which covers the light shielding film 19 and the interlayer insulator film 18 facing the opening 20.

The interlayer film 21 is subjected to the reflow treatment to form a recess 21a above the light receiving sensor unit 12 between the transfer electrodes 17. This recess 21a is processed to be adjusted to have a required curvature.

On this interlayer film 21 is formed a passivation film 22 covering its surface by making, e.g. a SiN film or SiON film using the plasma CVD process.

On the passivation film 22 is formed an intra-layer color filter 24 in a predetermined pattern of film by filling the recess 21a of the interlayer film 21 with, e.g. a pigment including photosetting resin.

Because the intra-layer color filter 24 is formed by filling the recess 21a of the interlayer film, a protuberance 24a with a curvature required for collecting an incident light onto the light receiving sensor unit 12 is formed in accordance with the curved surface of the recess 21a.

Figure 1:
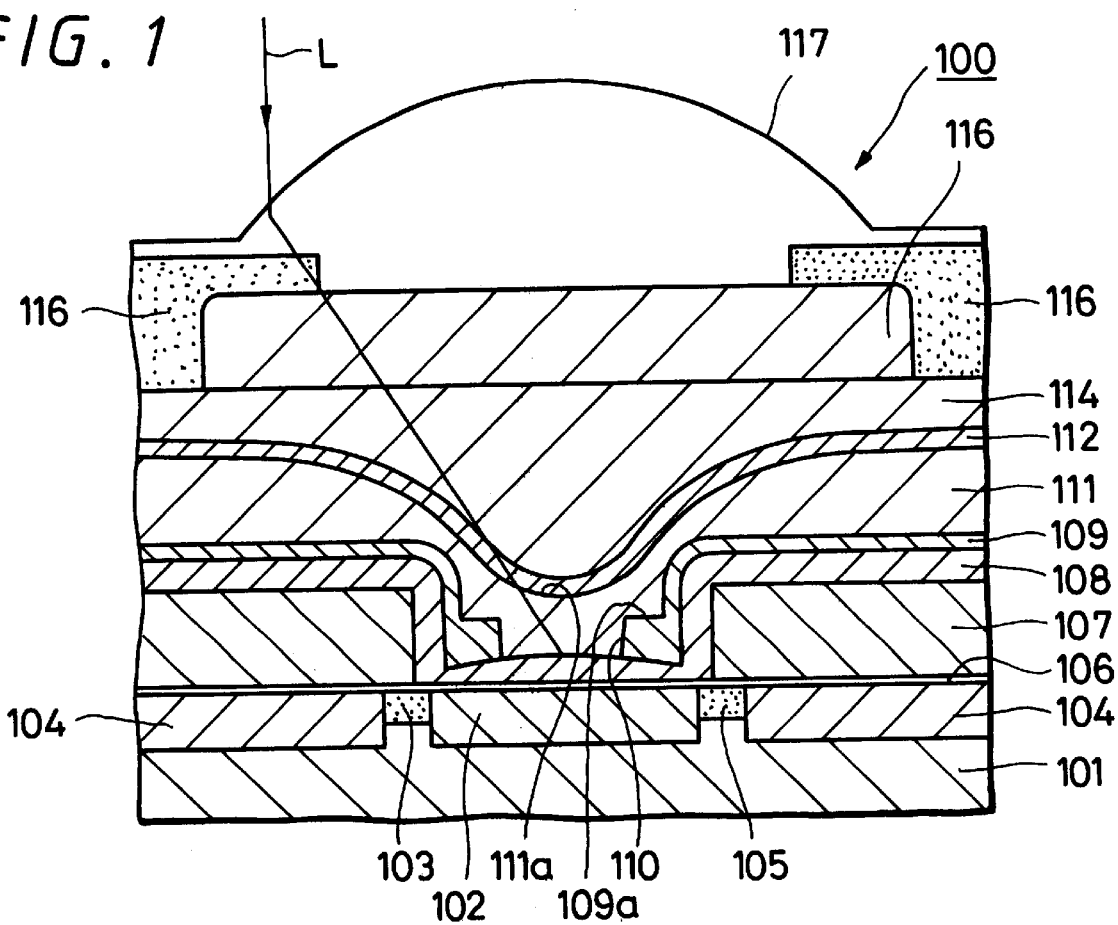
FIG. 1 is a schematic sectional diagram showing the conventional solid-state image sensing device.
Figure 2:
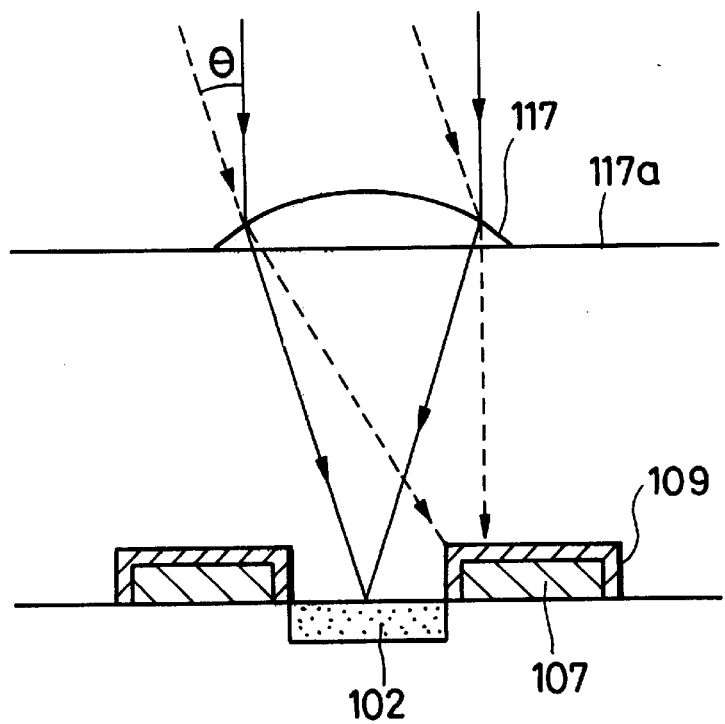
FIG. 2 is a diagram for explaining how the incident light on the lens is collected by the conventional solid-state image sensing device.

The intra-layer color filter 24 plays also a role of the intra-layer lens in the conventional solid-state image sensing device illustrated in FIG. 1 and therefore the color filter needs to have a greater refractive index than that of the BPSG forming the interlayer film 21. In this regard, the refractive index of BPSG of the interlayer film 21 is about 1.45 to 1.5.

This intra-layer color filter 24 is made of materials whose average refractive index in a visible light penetrating range is, e.g. 1.55 or more.

Additionally, the visible light penetrating range of color filter means the following wave length range.

red: 590–640 nm,
green: 500–580 nm,
blue: 420–480 nm,
magenta: 420–500 nm and 580–640 nm,
cyan: 420–580 nm,
yellow: 500–640 nm As the materials forming the intra-layer color filter 24, e.g. such that a pigment is dispersed in an acrylic negative resist of photopolymer or such that a dye is dissolved in a positive resist of novolak system may be employed.

Each of FIG. 4 to FIG. 9 shows a relation between the wave length (nm) and the refractive index in the respective materials of red, green, blue, magenta, cyan, yellow which form the intra-layer color filter 24.

As shown in FIG. 4 to FIG. 9, it can be seen that any average refractive index is 1.55 or more in the visible light penetrating range of the color filter.

On the intra-layer color filter 24 is formed a convex microlens 27 made of a transparent resin and the like.

This microlens 27 guides an incident light to the opening 19a of the light shielding film 19 through the intra-layer color filter 24 to collect the light onto the light receiving sensor unit 12. Therefore, the curvature of the microlens 27 is chosen to have a required value depending on the distance from the light receiving sensor unit 12 to the microlens 27 in the solid-state image sensing device 10 shown in FIG. 3.

Because, with the solid-state image sensing device 10 shown in FIG. 3, the intra-layer lens and the color filter are not formed separately but only the intra-layer color filter 24 is formed, it will be possible to make small the distance from the light receiving sensor unit to the microlens e.g. about 2.5 to 3.0 μm, thus causing the curvature of the microlens to be chosen smaller than that of the microlens of the conventional solid-state image sensing device 100 shown in FIG. 1.

Figure 10:
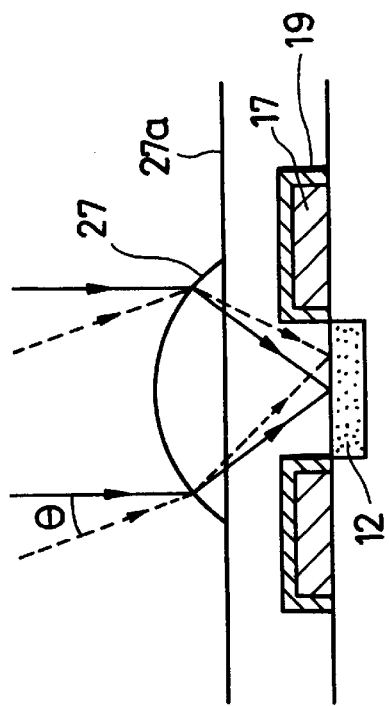
FIG. 10 is a diagram for explaining how the incident light on the lens is collected by the solid-state image sensing device according to the present invention.

As described above, because the solid-state image sensing device 10 shown in FIG. 3 enables the distance from the light receiving sensor unit to the arrangement plane of the microlens to be smaller than that of the conventional solid-state image sensing device 100 shown in FIG. 1, even though a slant incident light with respective to the microlens 27 increases as if the diaphragm of image sensing lens of camera is opened as shown in FIG. 10, the collected light by the microlens 27 will be incident onto the light receiving sensor unit 12, even when it deviates from the center of the opening of the light shielding film 19 as shown by broken lines in FIG. 10, which leads to an improvement of light collecting rate as compared with the conventional solid-state image sensing device.

In other words, even on the opened side of the diaphragm the drop of the sensitivity can be reduced.

Moreover, because it can be avoided that the collected light causes a signal charge to be mixed in the adjacent light receiving sensor unit 12 and charge transfer area (not shown), what is called a smear can be prevented from occurring.

Figure 11:
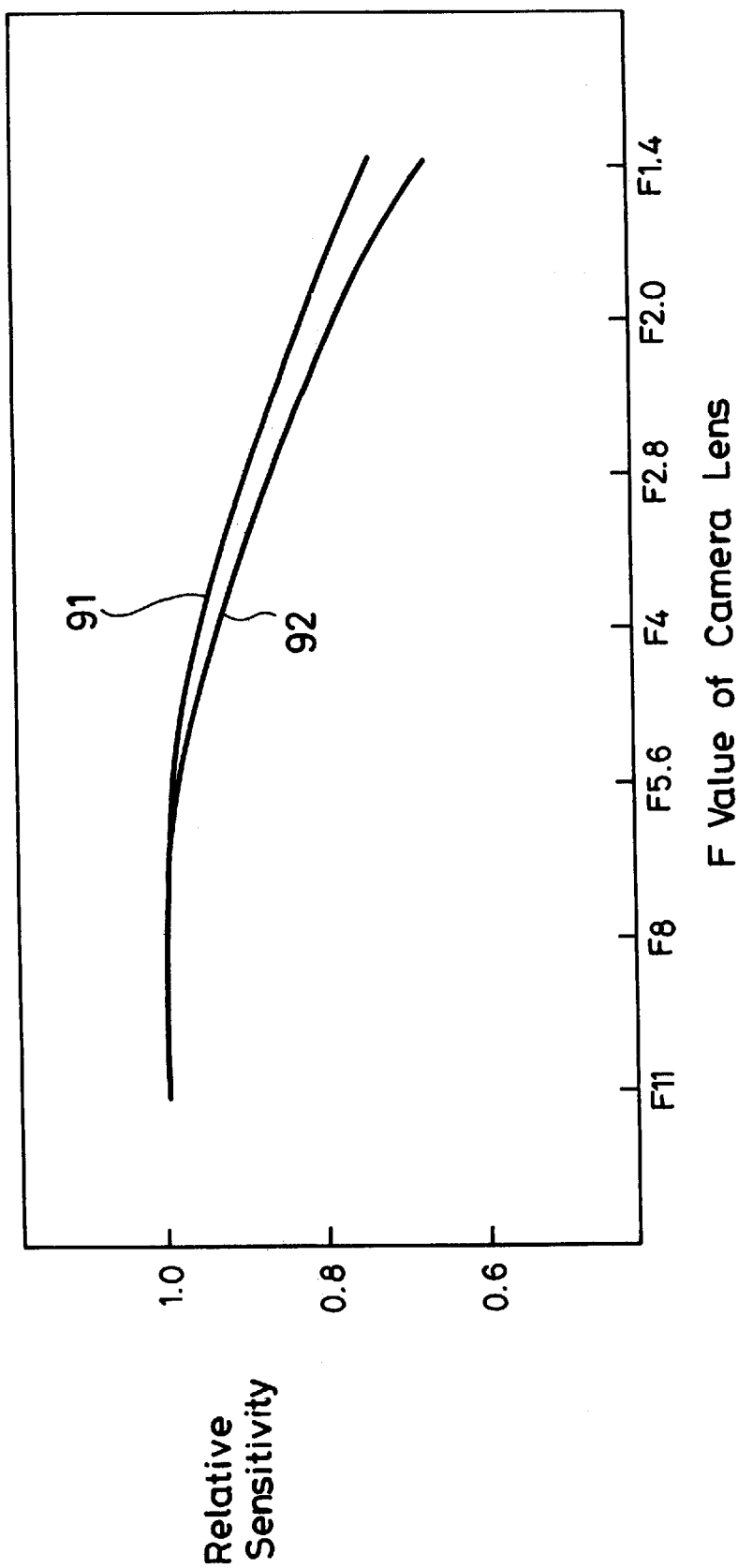
FIG. 11 is a diagram showing the relations between the F value of camera lens and the relative sensitivity with respect to the solid-state image sensing device according to the present invention and the conventional solid-state image sensing device.

FIG. 11 shows the relation between the F value of camera lens and the relative sensitivity, i.e. the dependence of sensitivity on F value when the conventional solid-state image sensing device 100 shown in FIG. 1 and the solid-state image sensing device 10 according to the present invention shown in FIG. 3 are applied to a solid-state image sensing device having a size of ¼ inch and three hundred and eighty thousand pixels, respectively.

In FIG. 11, a curve 91 represents the relation between the F value of a camera lens and the relative sensitivity in the solid-state image sensing device according to the present invention, and a curve 92 represents the relation between the F value of a camera lens and the relative sensitivity in the conventional solid-state image sensing device.

According to FIG. 11, it can be seen that, as compared with the conventional solid-state image sensing device 100, the solid-state image sensing device 10 according to the present invention enables the drop of the sensitivity to be reduced even if the F value is set small, i.e. the lens is opened.

Now, the method for manufacturing a solid-state image sensing device according to the present invention will be described below.

The solid-state image sensing device according to the present invention is manufactured by the process comprising the steps of forming the light receiving sensor unit and the transfer electrode on the substrate, forming the interlayer insulator film covering the transfer electrode, forming the light shielding film, piling to form the interlayer film covering the light shielding film, forming the recess on the interlayer film, forming the intra-layer color filter, on the interlayer film, having a protuberance formed by filling the recess in accordance with the curved surface of the recess, the protuberance having a curvature required for collecting the incident light onto the light receiving sensor unit, and forming the microlens on the intra-layer color filter.

An embodiment of the manufacturing method for the solid-state image sensing device according to the present invention shown in FIG. 3 will be described below with reference to the accompanying drawings, but the present invention is not limited to the following embodiment.

First of all, according to the known conventional process, e.g. on the silicon substrate 11 are formed the light receiving sensor unit 12, the readout gate 13, the charge transfer unit 14, the channel stop 15, the insulator film 16, and the transfer electrode 17, respectively. Further, the interlayer insulator film 18 covering the transfer electrode 17 is formed. Subsequently, the light shielding film 19 is formed by coating with the high melting point metal such as tungsten (W) or the like by the CVD process.

Figure 12:
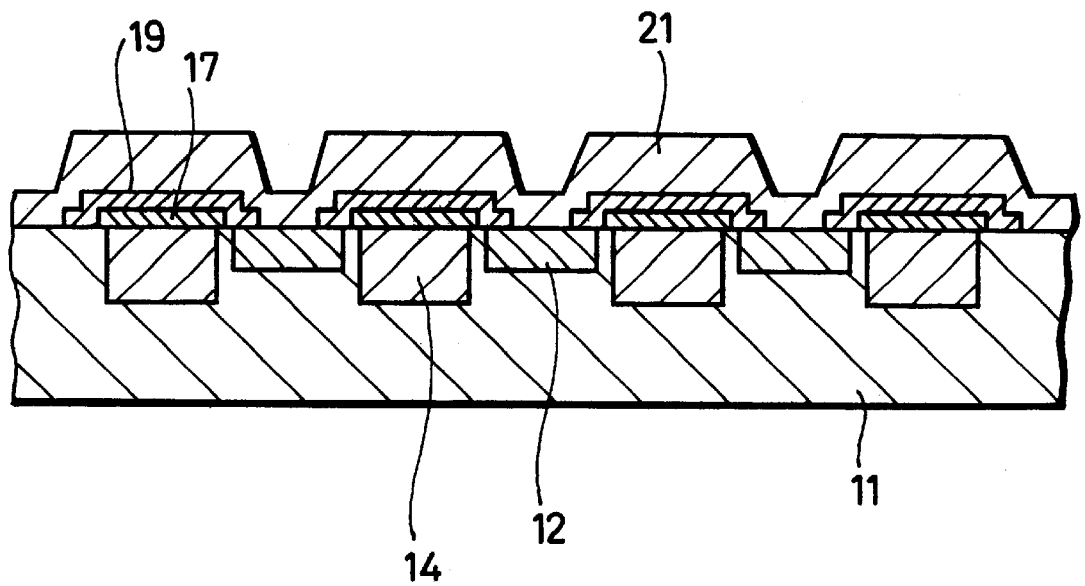
FIG. 12 is a diagram showing a manufacturing process for the solid-state image sensing device according to the present invention.

Next, as shown in FIG. 12, the interlayer film 21 is formed by using, e.g. BPSG and piling this according to the CVD process in such a manner as covers the light shielding film 19 and the like.

Figure 13:
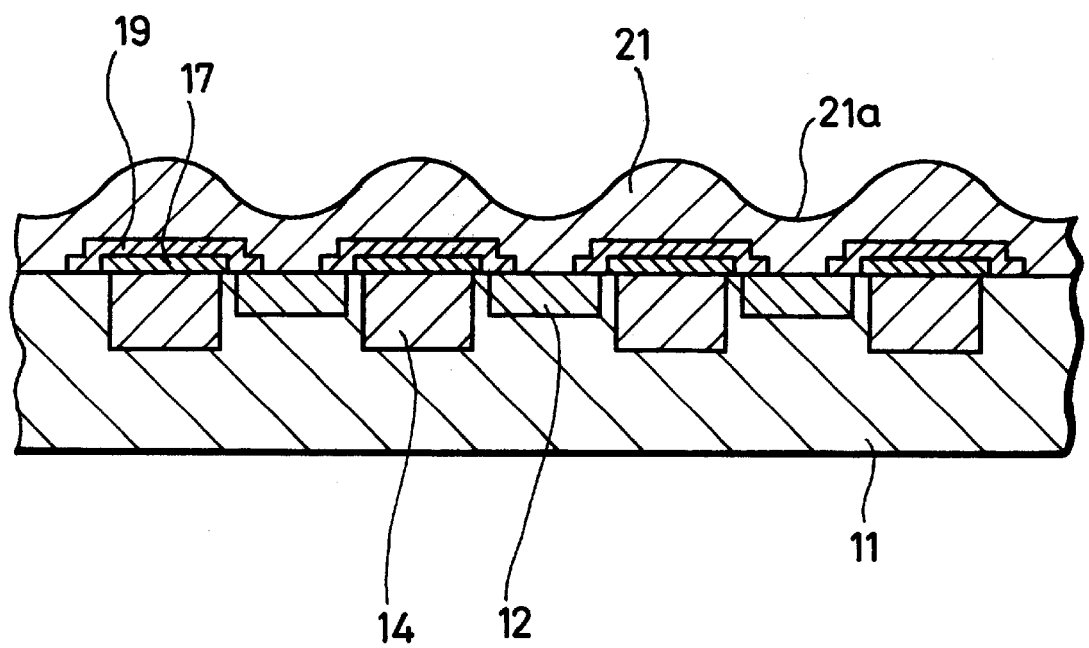
FIG. 13 is a diagram showing a manufacturing process for the solid-state image sensing device according to the present invention.

Next, as shown in FIG. 13, the interlayer film 21 is subjected to the reflow treatment, i.e. thermosofting treatment under a predetermined condition, e.g. at a temperature of about 700 to 800° C. to form the recess 21a on the interlayer film 21. At this time, because the intra-layer color filter 24 is thereafter formed on the recess 21a, which should have the function of the intra-layer lens, the recess 21a is formed so that it may have the curvature needed for the intra-layer color filter formed thereon to function as the intra-layer lens.

Next, on the interlayer film recess 21a is formed the passivation film 22 by making, e.g. a SiN film or SiON film using the plasma CVD process. This passivation film 22 prevents the mixture of ions from the upper layer into the lower layer, or the interlayer film 21.

Figure 14:
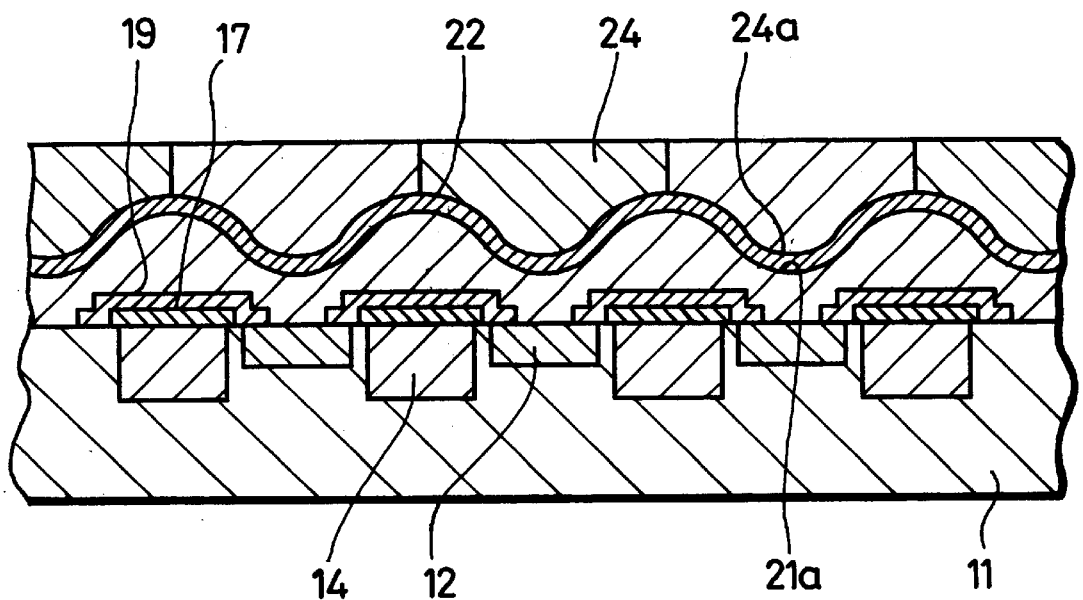
FIG. 14 is a diagram showing a manufacturing process for the solid-state image sensing device according to the present invention.

As is shown in FIG. 14, on the passivation film 22 is formed the intra-layer color filter 24 by filling the interlayer film recess 21a with e.g. a dye including photosetting resin to make a film of a predetermined pattern, in accordance with the curved surface of the recess 21a, the intra-layer color the filter having protuberance with the curvature required for collecting the incident light onto the light receiving sensor unit 12.

Because the intra-layer color filter 24 plays also a role of the intra-layer lens, materials having a larger refractive index than that of BRSG forming the interlayer film 21 are applied thereto. For example, the pigment dispersed in the acrylic negative resist or the dye dissolved in the positive resist of novolak system may be applied thereto.

The intra-layer color filter 24 is formed in such a shape as refracts the incident light appropriately depending on its orientation and incident angle so that the incident light on the intra-layer color filter 24 through the microlens 27 formed thereon may be guided to the opening 20 of the light shielding film 19.

Figure 15:
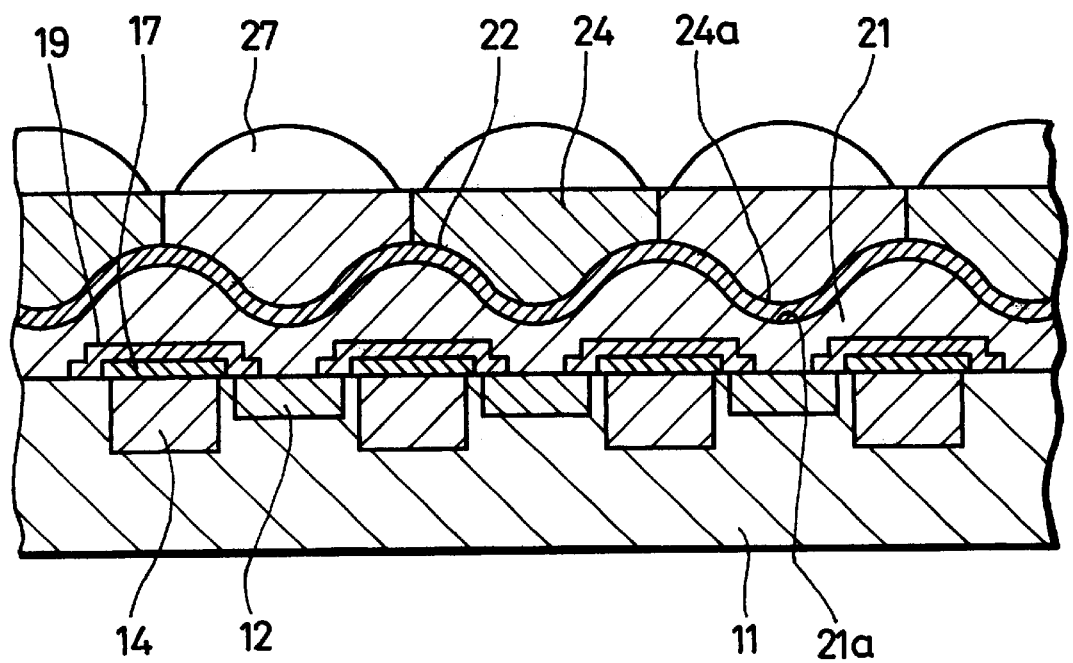
FIG. 15 is a diagram showing a manufacturing process for the solid-state image sensing device according to the present invention.

Next, as shown in FIG. 15, on the intra-layer color filter 24 is formed the microlens 27 made of, e.g. a transparent resin for the incident light.

This microlens 27 can be formed by a so-called etch back transcription, and so forth in which a photosetting transparent resin, etc. is piled on the upper surface of the intra-layer color filter 24, a resist pattern is further provided thereon, the resist is then reflow treated to be formed into a convex lens shape having the desired curvature, and the piled layer of the transparent resin is etched with the same as a mask, thereby making finally the desired microlens to be formed.

The curvature of the microlens 27 is chosen to have the required value depending on the distance from the light receiving sensor unit 12 to the arrangement plane of the microlens 27 in the solid-state image sensing device 10 shown in FIG. 3. In the solid-state image sensing device shown in FIG. 3, because only the intra-layer color filter is arranged to be formed, it will be possible to make smaller the distance from the light receiving sensor unit to the arrangement plane of the microlens than that of the conventional structure, e.g. 2.5–3.0 $\mu$m. Thus, the curvature of the microlens is chosen to be smaller than that of the microlens in the conventional solid-state image sensing device 100 shown in FIG. 1. In this way, the solid-state image sensing device shown in FIG. 3 can be manufactured.

In the solid-state image sensing device 10 shown in FIG. 3, the incident light L is collected by the microlens 27 and further is incident on the intra-layer color filter 24. The intra-layer color filter 24 collects again the light because of having a role of the intra-layer lens. The incident light L goes into the opening 20 of the light shielding film 19, penetrates through the interlayer insulator film 18 and the insulator film 16, and reaches the light receiving sensor unit 12 where the photoelectric conversion is carried out.

Having described the embodiment in which the recess 21a of the interlayer film is formed by applying the thermosoftening treatment to the interlayer film 21, the present invention is not limited to this embodiment. For example, it may be formed also by a chemical technique which dissolves the interlayer film 21 or by coating the interlayer film with a resin to form the required curvature.

In addition, having described the embodiment in which the interlayer film 21 is formed of the BPSG, the present invention is not limited to this embodiment and known conventional materials such as PSG or the like may be applied thereto.

According to the solid-state image sensing device of the present invention shown in FIG. 3, because the intra-layer color filter 24 is formed, which plays both roles of the intra-layer lens and the color filter forming the conventional solid-state image sensing device with the intra-layer lens shown in FIG. 1, thus abolishing the separate manufacture of the intra-layer lens and the color filter, the distance from the light receiving sensor unit 12 performing the photoelectric conversion to the arrangement plane of the microlens 27 could have been made small.

For this reason, as shown in FIG. 10, although the aslant incident light relative to the microlens 27 increases as if the diaphragm of the image sensing lens of camera is opened, the collected light by the microlens 27 has never come to deviate from the center of the opening of the light shielding film. This has enabled the improvement of the light collecting rate to be accomplished.

Furthermore, with the solid-state image sensing device 10 shown in FIG. 3, because it is possible to make smaller than before the distance from the light receiving sensor unit 12 to the arrangement plane of the microlens 27, the curvature of the microlens could have been chosen to be small. This has made it possible to avoid a situation that, as shown in FIG. 3, the incident light L collected by the microlens 27 is rejected by the edge of the intra-layer color filter 24, which has lead to an improvement of the picture quality.

Also, according to the above described method for manufacturing the solid-state image sensing device of the present invention shown in FIG. 3, because both of the intra-layer lens and the color filter are not manufactured independently, it being sufficient to form only the intra-layer color filter 24 having both of these functions, the simplification of manufacturing process for the solid-state image sensing device could have been accomplished.

According to the solid-state image sensing device of the present invention, because it is arranged that only the intra-layer color filter is formed, which has both functions of the intra-layer lens as well as the color filter and plays both roles, the distance from the light receiving sensor unit to the arrangement plane of the microlens could have been made small.

For this reason, although the aslant incident light relative to the microlens increases as if the diaphragm of image sensing lens of camera is opened, the collected light by the microlens has never come to deviate from the center of the opening of the light shielding film, thus allowing the drop of the light collecting rate to be avoided effectively.

Moreover, because the distance from the light receiving sensor unit to the arrangement plane of the microlens can be made small, the curvature of the microlens could have been chosen to be small. This has made it possible to avoid that the collected light L through the microlens is rejected by the edge of the color filter, which has lead to the improvement of the picture quality.

According to the method for manufacturing the solid-state image sensing device of the present invention, it is not necessary to manufacture separately the intra-layer lens and the color filter, it being sufficient to form only the intra-layer color filter, thereby allowing the simplification of manufacturing process for the solid-state image sensing device to be accomplished.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A solid-state image sensing device having a light receiving sensor unit performing a photoelectric conversion on a substrate, comprising:

an interlayer film having a recess on said light receiving sensor unit, and an intra-layer color filter on said interlayer film having a protuberance formed by filling said recess in accordance with a curved surface of said recess, said protuberance having a curvature required for collecting an incident light onto said light receiving sensor unit, wherein said intra-layer color filter plays also a role of an intra-layer lens for collecting an incident light onto said light receiving sensor unit.

2. A solid-state image sensing device as claimed in claim 1, wherein said intra-layer color filter has thereon a microlens.

3. A solid-state image sensing device according to claim 1, characterized in that an average refractive index of said intra-layer color filter in a visible light penetrating range is selected to be a value greater than a refractive index of said interlayer film.

4. A solid-state image sensing device according to claim 3, characterized in that said average refractive index of said intra-layer color filter in a visible light penetrating range is 1.55 or more.

5. A solid-state image sensing device according to claim 1 being a CCD (charge-coupled device).

6. A solid-state image sensing device according to claim 1 being a CMOS sensor.

7. A method for manufacturing a solid-state image sensing device, comprising the steps of forming a light receiving sensor unit on a substrate, forming a transfer electrode on said substrate, forming an interlayer insulator film covering said transfer electrode, forming a light shielding film, forming an interlayer film covering said light shielding film in a piling fashion, forming a recess on said interlayer film, and forming an intra-layer color filter on said interlayer film, having a protuberance formed by filling said recess in accordance with a curved surface of said recess, said protuberance having a curvature required for collecting an incident light onto said light receiving sensor unit.

8. A method for manufacturing a solid-state image sensing device according to claim 7 further comprising the step of forming a microlens on said intra-layer color filter.

9. A method for manufacturing a solid-state image sensing device according to claim 7, wherein said recess on said interlayer film is formed by a thermosoftening treatment to said interlayer film.

* * * * *